United States Patent [19]
Doi et al.

[11] Patent Number: 5,478,692
[45] Date of Patent: Dec. 26, 1995

[54] POSITIVE-WORKING NAPHTHOQUINONE DIAZIDE SULFONIC ACID ESTER PHOTORESIST COMPOSITION CONTAINING 4,4'-BIS(DIALKYLAMINO)BENZOPHENONE

[75] Inventors: Kousuke Doi; Taku Nakao; Remi Numata; Nobuo Tokutake; Hidekatsu Kohara; Toshimasa Nakayama, all of Kanagawa, Japan

[73] Assignee: Tokyo Ohka Kogyo Co., Ltd., Kawasaki, Japan

[21] Appl. No.: 350,128

[22] Filed: Nov. 29, 1994

[30] Foreign Application Priority Data

Nov. 29, 1993 [JP] Japan ................. 5-323168

[51] Int. Cl.$^6$ ................. G03F 7/023
[52] U.S. Cl. ................. 430/191; 430/192; 430/193
[58] Field of Search ................. 430/191, 192, 430/193

[56] References Cited

U.S. PATENT DOCUMENTS

| | | | |
|---|---|---|---|
| 4,707,430 | 11/1987 | Ozawa et al. | 430/191 |
| 4,738,915 | 4/1988 | Komine et al. | 430/191 |
| 5,238,775 | 8/1993 | Kajita et al. | 430/191 |

FOREIGN PATENT DOCUMENTS

| | | |
|---|---|---|
| 61-241759 | 10/1986 | Japan . |
| 5-119474 | 5/1993 | Japan . |

Primary Examiner—Charles L. Bowers, Jr.
Assistant Examiner—Christopher G. Young
Attorney, Agent, or Firm—Wenderoth, Lind & Ponack

[57] ABSTRACT

Proposed is a novel positive-working photoresist composition suitable for use in the fine patterning works in the manufacture of electronic devices and capable of exhibiting excellent performance with high resolution, high sensitivity, wide range of focusing depth, large exposure dose latitude and other characteristics. The photoresist composition is formulated, in addition to the basic ingredients of an alkali-soluble novolac resin as a film-forming agent and photosensitive ingredient such as an ester of naphthoquinone-1, 2-diazide sulfonic acid and a polyhydroxy compound, with a limited amount of 4,4'-bis(dialkylamino) benzophenone, e.g., 4,4'-bis(diethylamino) benzophenone, preferably, in combination with a polyhydroxy compound such as 4,6-bis [1-methyl-1-(4-hydroxyphenyl)ethyl]-1,3-dihydroxy phenol.

10 Claims, No Drawings

5,478,692

POSITIVE-WORKING NAPHTHOQUINONE DIAZIDE SULFONIC ACID ESTER PHOTORESIST COMPOSITION CONTAINING 4,4'-BIS(DIALKYLAMINO)BENZOPHENONE

BACKGROUND OF THE INVENTION

The present invention relates to a novel positive-working photoresist composition or, more particularly, to a positive-working photoresist composition capable of forming an extremely fine pattern of the resist layer even on a substrate surface having level differences or having high reflectivity of light with high resolution and sensitivity as well as with a wide range of focusing depth and a large exposure dose latitude.

The technology of photolithographic patterning by using a photoresist composition to form a patterned resist layer is well established in the manufacture of fine electronic devices including semiconductor devices such as ICs, LSIs and the like and liquid crystal display panels. The photoresist compositions most widely under practical use include those alkali-developable positive-working ones comprising an alkali-soluble resin as a film-forming ingredient and a quinone diazido group-containing compound as a photosensitive ingredient. The above mentioned alkali-soluble resin as a film-forming ingredient is typically a novolac resin which is preferred due to the good developability behavior with rapid dissolution without swelling in an alkaline aqueous developer solution and high resistance against the attack of plasma and elevated temperatures in the course of the dry-etching treatment required for a patterned resist layer as an etching mask.

The quinonediazido group-containing compound as the photosensitive ingredient is unique because the compound inherently has an activity to suppress the solubility of the novolac resin in an aqueous medium while, when exposed to actinic rays including electromagnetic waves such as ultraviolet light of so-called g-line and i-line and far-ultraviolet light such as excimer laser beams as well as corpuscular beams such as electron beams as blended with a novolac resin, the compound has an effect of promoting the solubility of the novolac resin in an alkaline medium along with the alkali-solubility imparted to the compound per se. Accordingly, a large number of positive-working photoresist compositions comprising an alkali-soluble novolac resin and a quinonediazido group-containing compound to exhibit a great change in the solubility behavior by the irradiation with actinic rays, i.e. electromagnetic waves and corpuscular beams, suitable for practical use are disclosed in, for example, U.S. Pat. No. 4,377,631, Japanese Patent Kokai No. 62-35349, No. 1-142548 and No. 1-179147, Japanese Patent Publication No. 3-4897 and elsewhere.

It is a remarkable trend in recent years in the field of the electronic industry that the degree of integration in semiconductor devices or the fineness in the patterning of liquid crystal display panels is rapidly increasing. For example, extremely fine patterning of so-called sub-micron or half-micron order or even finer is required in the manufacturing process of VLSIs which cannot be achieved without improvements in the performance of the positive-working photoresist compositions used therein. Namely, a positive-working photoresist composition is required to have high sensitivity to actinic rays from the standpoint of productivity, a wide range of focusing depth in order to give a patterned resist layer with high fidelity to the mask pattern even on a substrate surface having level differences, an excellent halation-preventing effect and a sufficiently large exposure dose latitude and also to be capable of giving a patterned resist layer of high resolution and an excellently orthogonal cross sectional profile of a line pattern having good heat resistance to withstand the heat treatment before development after exposure and resistance against plasma in dry etching.

Various additives have been proposed to a positive-working photoresist composition, by which the above described requirements could be satisfied though with respective problems and disadvantages. For example, Japanese Patent Kokai No. 61-141441 discloses a positive-working photoresist composition with admixture of a trihydroxy benzophenone compound although the resist composition is poor in the heat resistance if not without improvements in the sensitivity and developability. Further, Japanese Patent Kokai No. 61-241759 proposes admixture of a photosensitive layer consisting of an esterification product of a phenol novolac resin with o-naphthoquinone diazide sulfonic acid with 1 to 20% by weight of 4,4'-dimethylaminobenzophenone, 4,4'-diethylaminobenzophenone and the like as a halation-preventing agent. Such a resist composition is dilemmatic because the desired halation-preventing effect is insufficient when the amount of the additive is too small while a sufficient halation-preventing effect is obtained only by the admixture of such an amount of the additive as to cause a decrease in the sensitivity because the additive compound per se has a strong absorption of light in the wavelength range having effectiveness to the patterning of the photoresist layer. Moreover, an extremely fine resist pattern in the half-micron range can hardly be obtained with such a photoresist composition. Further, Japanese Patent Kokai No. 5-119474 discloses a positive-working photoresist composition capable of exhibiting a high halation-preventing effect by the admixture of a positive-working photoresist composition comprising an alkali-soluble resin and a 1,2-naphthoquinonediazido group-containing compound with a benzophenone compound including 4-aminobenzophenone, 2-carboxy-4-aminobenzophenone and derivatives thereof. This photoresist composition, however, is not suitable for the extremely fine patterning works in the half-micron range or finer with a limit of 0.5 to 0.6 μm of the resolution in a patterned resist layer thereof.

It would be a due idea that the desired improvement in the resolution of the patterned photoresist layer could be obtained by the improvements in the exposure machine. For example, a proposal is made for the use of an exposure lens having an increased numerical aperture but an increase in the numerical aperture of a lens is necessarily accompanied by a decrease in the range of the focusing depth so that such a measure is not practical when the substrate surface has a large level difference.

SUMMARY OF THE INVENTION

The present invention accordingly has an object, in view of the above described prior art situations, to provide a novel and improved positive-working photoresist composition capable of giving an extremely fine patterned resist layer with high resolution and high heat resistance and having an excellently orthogonal cross sectional profile of a line pattern with high sensitivity to actinic rays, wide range of focusing depth, good halation-preventing effect and large exposure dose latitude.

Thus, the present invention provides a novel and improved positive-working photoresist composition which comprises, as a uniform mixture:

(a) an alkali-soluble resin;

(b) an ester of naphthoquinone-1,2-diazide sulfonic acid; and (c) a 4,4'-bis(dialkylamino) benzophenone in a specified amount, preferably, in the range from 0.1% to 0.5% by weight based on the total amount of the components (a) and (b) in the composition.

DETAILED DESCRIPTION OF THE PREFERRED EMBODIMENTS

As is described above, the inventive positive-working photoresist composition comprises three essential ingredients including the components (a), (b) and (c), of which the most characteristic feature of the inventive composition is the addition of the 4,4'-bis(dialkylamino) benzophenone as a unique additive in a specific amount.

The component (a) in the inventive photoresist composition is an alkali-soluble resin to serve as a film-forming ingredient which is not particularly limitative and can be selected without limitations from the alkali-soluble resins used in conventional positive-working photoresist compositions including the condensation products of an aromatic hydroxy compound such as phenol, cresol, xylenol and the like and an aldehyde such as formaldehyde and the like or a ketone such as acetone, polyhydroxystyrene and derivatives thereof and so on.

Examples of the above mentioned aromatic hydroxy compound include phenol, alkyl phenols such as m-, p- and o-cresols, 2,3-, 2,5-, 3,5- and 3,4-xylenols, 2-, 3- and 4-ethyl phenols, 2,3,5-trimethyl phenol, 2,3,5-triethyl phenol, 2-, 3- and 4-tert-butyl phenols, 2-tert-butyl-4-methyl phenol, 2-tert- butyl-5-methyl phenol, alkoxy phenols such as p- and m-methoxy phenols, p- and m-ethoxy phenols and p- and m-propoxy phenols, isopropenyl phenols such as o- and p-isopropenyl phenols, 2-methyl-4-isopropenyl phenol and 2-ethyl-4-isopropenyl phenol, aryl phenols such as phenylphenols, and polyhydroxy phenols such as 4,4'-dihydroxy biphenyl, bisphenol A, resorcinol, hydroquinone and pyrogallol, of which m- and p-cresols, 2,5- and 3,5-xylenols and 2,3,5-trimethyl phenol are particularly preferable. These aromatic hydroxy compounds can be used either singly or as a combination of two kinds or more according to need.

Examples of the aldehyde compound to pertain to the condensation reaction with the above described aromatic hydroxy compound include formaldehyde, paraformaldehyde, trioxane, acetaldehyde, propionaldehyde, butyraldehyde, trimethyl acetaldehyde, acrolein, crotonaldehyde, cyclohexane aldehyde, furfural, furyl acrolein, benzaldehyde, terephthalaldehyde, phenyl acetaldehyde, α- and β-phenyl propylaldehydes, o-, m- and p-hydroxy benzaldehydes, o-, m- and p-methyl benzaldehydes, o-, m- and p-chloro benzaldehydes and cinnamaldehyde, of which formaldehyde is preferred and, when an increased heat resistance is desired of the photoresist composition, hydroxy benzaldehydes are particularly preferable. These aldehyde compounds can be used either singly or as a combination of two kinds or more according to need.

Examples of the ketone compound as an alternative of the aldehyde compound to react with the aromatic hydroxy compound include acetone, methyl ethyl ketone, diethyl ketone, diphenyl ketone and the like either singly or as a combination of two kinds or more according to need. Acetone is particularly preferable when the aromatic hydroxy compound is pyrogallol.

The condensation reaction of an aromatic hydroxy compound and an aldehyde or ketone can be performed according to a known procedure in the presence of an acid as the catalyst. Examples of the acid suitable as the catalyst include hydrochloric acid, sulfuric acid, formic acid, acetic acid, oxalic acid and p-toluene sulfonic acid. The alkali-soluble resin obtained as the product of the condensation reaction is preferably freed from low-molecular fractions by undertaking a suitable fractionation treatment so that the resin is imparted with a further improved heat resistance. The fractionation treatment can be performed by the re-precipitation method in which the resin product obtained by the condensation reaction is dissolved in a good solvent therefor such as alcohols, e.g., methyl and ethyl alcohols, ketones, e.g., acetone and methyl ethyl ketone, ethyleneglycol monoethyl ether acetate, tetrahydrofuran and the like and the resin solution is added into a large volume of water so as to precipitate the resinous polymer of high molecular-weight fractions. The alkali-soluble resin as the component (a) in the inventive photoresist composition should have a weight-average molecular weight in the range from 2000 to 25000 or, preferably, from 2500 to 20000. The weight-average molecular weight implied above refers to the value obtained by the gel permeation chromatography with polystyrenes as the reference material.

The polyhydroxystyrene and derivatives thereof as an alternative of the above described condensation product of an aromatic hydroxy compound and an aldehyde or ketone include homopolymers of vinyl phenol and copolymers of vinyl phenol with a comonomer copolymerizable therewith. The comonomers copolymerizable with vinyl phenol include acrylic and methacrylic acids and esters thereof, acrylonitrile, methacrylonitrile, styrene, α-methyl styrene, p- and o-methyl styrenes, p-methoxy styrene and p-chloro styrene.

The second essential ingredient, i.e. component (b), in the inventive photoresist composition is an ester of a naphthoquinone-1,2-diazide sulfonic acid to serve as a photosensitive ingredient. Examples of suitable compounds as the component (b) include esterification products of a naphthoquinone-1,2-diazide sulfonic acid such as naphthoquinone-1,2-diazide-5-sulfonic acid, naphthoquinone-1,2-diazide-4-sulfonic acid, naphthoquinone-1,2-diazide-6-sulfonic acid and the like with a polyhydroxy compound. The esterification reaction can be either complete or partial relative to the hydroxy groups in the polyhydroxy compound.

The polyhydroxy compound as the esterification agent of the naphthoquinone diazide sulfonic acid compound includes those belonging to the following six classes.

Examples of suitable polyhydroxy compounds belonging to the first class include polyhydroxy benzophenone compounds such as 2,3,4-trihydroxy benzophenone, 2,4,4'-trihydroxy benzophenone, 2,4,6-trihydroxy benzophenone, 2,3,4,4'-tetrahydroxy benzophenone, 2,2',4,4'-tetrahydroxy benzophenone, 2,3',4,4',6-pentahydroxy benzophenone, 2,2',3,4,4'-pentahydroxy benzophenone, 2,2',3,4,5'-pentahydroxy benzophenone, 2,3',4,5,5'-pentahydroxy benzophenone, 2,3,3',4 4',5'-hexahydroxy benzophenone and the like.

Examples of suitable polyhydroxy compounds belonging to the second class include those compounds represented by the general formula

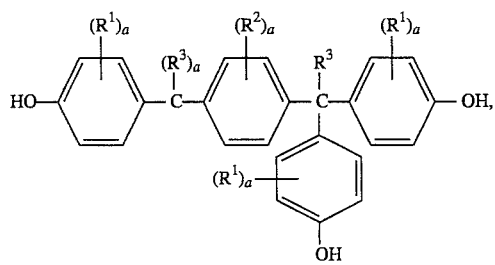 (I)

in which each $R^1$ is, independently from the others, a hydrogen atom, halogen atom, hydroxy group, alkyl group having 1 to 4 carbon atoms or alkenyl group having 2 to 4 carbon atoms, each $R^2$ is, independently from the others, a hydrogen atom, halogen atom or alkyl group having 1 to 4 carbon atoms, each $R^3$ is, independently from the others, a hydrogen atom or alkyl group having 1 to 4 carbon atoms and the subscript a is 1 or 2, such as 1-[1-(4-hydroxyphenyl)isopropyl]-4-[1,1-bis(4-hydroxyphenyl)ethyl] benzene and the like.

Examples of suitable polyhydroxy compounds belonging to the third class include tris(hydroxyphenyl) methane compounds represented by the general formula

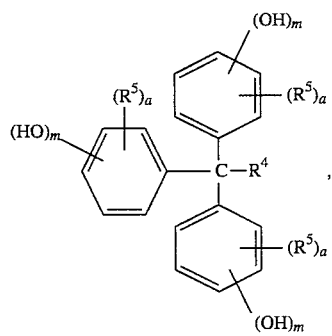 (II)

in which $R^4$ is a hydrogen atom or alkyl group having 1 to 4 carbon atoms, each $R^5$ is, independently from the others, a hydrogen atom, halogen atom, alkyl group having 1 to 4 carbon atoms or alkoxy group having 1 to 4 carbon atoms, the subscript a is 1 or 2 and the subscript m is 1, 2 or 3, such as tris(4-hydroxyphenyl) methane, bis(4-hydroxy-3,5-dimethylphenyl)-4-hydroxyphenyl methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethyl-phenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxy-3,5-dimethylphenyl)-2,3,4-trihydroxyphenyl methane, bis(4-hydroxy-2,5-dimethylphenyl)-2,3,4-trihydroxyphenyl methane, bis(4-hydroxyphenyl)-3-methoxy-4-hydroxyphenyl methane and the like.

Examples of suitable polyhydroxy compounds belonging to the fourth class include bis(cyclohexyl hydroxy phenyl)hydroxyphenyl methane compounds such as bis(3-cyclohexyl-4-hydroxy phenyl)-3-hydroxyphenyl methane, bis(3-cyclohexyl-4-hydroxy phenyl)-2-hydroxyphenyl methane, bis(3-cyclohexyl-4-hydroxy phenyl)-4-hydroxyphenyl methane, bis(5-cyclohexyl-4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2-methylphenyl)-4-hydroxyphenyl methane, bis(5-cyclohexyl-4-hydroxy-2-methylphenyl)-3,4-dihydroxyphenyl methane, bis(3-cyclohexyl-6-hydroxy phenyl)-3-hydroxyphenyl methane, bis (3-cyclohexyl-6-hydroxy phenyl)-4-hydroxyphenyl methane, bis (3-cyclohexyl-6-hydroxy phenyl)-2-hydroxyphenyl methane, bis(5-cyclohexyl-2-hydroxy-4-methylphenyl)-2-hydroxyphenyl methane, bis(5-cyclohexyl-2-hydroxy-4-methylphenyl)-4-hydroxyphenyl methane, bis(5-cyclohexyl-2-hydroxy-4-methylphenyl)-3,4-dihydroxyphenyl methane and the like.

Examples of suitable polyhydroxy compounds belonging to the fifth class include [(poly)hydroxyphenyl] alkane compounds such as 2-(2,3,4-trihydroxyphenyl)-2-(2',3',4'-trihydroxyphenyl) propane, 2-(2,4-dihydroxyphenyl)-2-(2',4'-dihydroxyphenyl) propane, 2-(4-hydroxyphenyl)-2-(4'-hydroxyphenyl) propane, bis(2,3,4-trihydroxyphenyl) methane, bis(2,4-dihydroxyphenyl) methane, and the like.

Examples of suitable polyhydroxy compounds belonging to the sixth class include other hydroxy compounds such as phenol, 4-methoxy phenol, dimethyl phenols, hydroquinone, bisphenol A, naphthols, pyrocatechol, pyrogallol monomethyl ether, pyrogallol 1,3-dimethyl ether, gallic acid, partial esterification or etherification products of gallic acid and the like.

The polyhydroxy compound to be reacted with naphthoquinone-1,2-diazide sulfonic acid to give an esterification product as the component (b) can be selected from the compounds of the above described first to sixth classes depending on the desired characteristics of the photoresist composition such as sensitivity, resolution of images, heat resistance and range of focusing depth. Particularly preferable polyhydroxy compounds include 2,3,4-trihydroxy benzophenone and 2,3,4,4'-tetrahydroxy benzophenone belonging to the first class, 1-[1-(4-hydroxyphenyl)isopropyl]-4-[1,1-bis( 4-hydroxyphenyl)ethyl] benzene belonging to the second class, bis(4-hydroxy-3,5-dimethylphenyl)-2-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5-dimethylphenyl)-3,4-dihydroxyphenyl methane and bis(4-hydroxyphenyl)-3-methoxy-4-hydroxyphenyl methane belonging to the third class, bis(5-cyclohexyl-4-hydroxy-2-methylphenyl)-2-hydroxyphenyl methane, bis(5-cyclohexyl-4-hydroxy-2-methylphenyl)-3-hydroxyphenyl methane, bis(5-cyclohexyl-4-hydroxy-2 -methylphenyl)-4-hydroxyphenyl methane and bis(5-cyclohexyl-4-hydroxy-2-methylphenyl)-3,4-dihydroxyphenyl methane belonging to the fourth class and 2-(2,3,4-trihydroxyphenyl)-2 -(2',3',4'-trihydroxyphenyl) propane, 2-(2,4-dihydroxyphenyl)-2-(2',4'-dihydroxyphenyl) propane and bis(2,3,4-trihydroxyphenyl)methane belonging to the fifth class.

The component (b) as the photosensitive ingredient in the inventive positive-working photoresist composition can be prepared by the full or partial esterification reaction in which a naphthoquinone-1,2-diazide-4- or -5-sulfonyl halide is subjected to a condensation reaction with a polyhydroxy compound, which is preferably a benzophenone compound, 1-[1-(4-hydroxyphenyl)isopropyl]-4-[1,1-bis(4-hydroxyphenyl)ethyl] benzene, tris(hydroxyphenyl) methane compound, bis(cyclohexylhydroxyphenyl) hydroxyphenyl methane compound or [(poly)hydroxyphenyl] alkane compound. The esterification reaction is performed usually in a solvent capable of dissolving both of the reactants such as dioxane in the presence of a hydrogen halide acceptor such as triethanolamine, alkali carbonate and alkali hydrogen carbonate.

It is preferable that the degree of esterification in the above mentioned esterification product is at least 50% or, more preferably, at least 60% relative to the hydroxy groups in the starting polyhydroxy compound in respect of the improved resolution in the patterning with the photoresist composition. Namely, the esterification reaction of the polyhydroxy compound is performed with the naphthoquinone-2-diazide-4- or -5-sulfonyl halide in an amount of at least 50% by moles or, preferably, at least 60% by moles relative to the hydroxy groups in the polyhydroxy compound.

The amount of the component (b) in the inventive photoresist composition is usually in the range from 5 to 100% by weight based on the amount of the alkali-soluble resin as the component (a). When the amount of the component (b) is too small, the patterned resist layer formed by using the photoresist composition is poor relative to the fidelity to the mask pattern affecting the quality of the reproduced images while, when the amount thereof is too large, a decrease is caused in the uniformity of the resist layer affecting the resolving power of the reproduced image.

In addition to the above described essential components (a) and (b), the photoresist composition of the invention contains a third essential ingredient as the component (c) which is a 4,4'-bis(dialkylamino) benzophenone of which the alkyl group preferably has 1 to 4 carbon atoms. Examples of suitable 4,4'-bis(dialkylamino) benzophenone compounds include 4,4'-bis(dimethylamino) benzophenone, 4,4'-bis(diethylamino) benzophenone, 4,4'-bis(di-n-propylamino) benzophenone, 4,4'-bis(diisopropylamino) benzophenone, 4,4'-bis(dibutylamino) benzophenone, 4-dimethylamino-4'-diethylamino benzophenone, 4,4'-bis(methylethylamino) benzophenone and the like, of which 4,4'-bis(dimethylamino) benzophenone and 4,4'-bis(diethylamino) benzophenone are particularly preferable. These 4,4'-bis(dialkylamino) benzophenone compounds can be used either singly or as a combination of two kinds or more according to need.

The amount of the above described component (c) in the inventive photoresist composition is in the range from 0.1 to 0.5% by weight or, preferably, from 0.1 to 0.4% by weight based on the total amount of the components (a) and (b). When the amount of the component (c) is too small, the desired improvement by the addition of this ingredient cannot be fully obtained as a matter of course while, when the amount thereof is too large, adverse influences are caused on the sensitivity of the composition and resolution of the patterned images.

Addition of a 4,4'-bis(dialkylamino) benzophenone to a photosensitive composition is not novel and taught, for example, in Japanese Patent Kokai 61-241759, which, however, relates to a waterless planographic printing plate consisting of a substrate, a photosensitive layer containing a quinone diazide compound and a layer of a silicone rubber in this order. It is taught there that the reproducibility of fine dots on the printing plate can be improved when the photosensitive layer contains a photoabsorber which is typically a 4,4'-bis(dialkylamino) benzophenone in an amount in the range from 1 to 20% by weight teaching away admixture of the photoabsorber in any smaller amounts than 1% by weight since no improvement can be obtained thereby. Even though the technology of waterless planographic printing plates is quite different from the technology of the positive-working photoresist composition used in the patterning works in the manufacture of semiconductor devices and the like, accordingly, it is a quite unexpected and surprising discovery that great improvements can be obtained in the performance of a positive-working photoresist composition such as sensitivity, range of focusing depth and latitude of light exposure dose of the composition as well as resolution, cross sectional profile and heat resistance of the patterned resist layer when and only when the amount of a 4,4'-bis(dialkylamino) benzophenone added to the photoresist composition is in the range from 0.1 to 0.5% by weight based on the total amount of the other essential ingredients.

It is optional that the positive-working photoresist composition of the invention comprising the above described essential components (a), (b) and (c) is further admixed according to need with, as the component (d), an additional polyhydroxy aromatic compound selected from the compounds belonging to the second and third classes of the polyhydroxy aromatic compounds of the general formulas (I) and (II), respectively, used as a reactant in the preparation of the component (b), and the compounds represented by the general formula

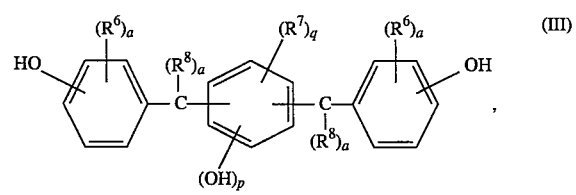

in which each $R^6$ is, independently from the others, a hydrogen atom, halogen atom, hydroxy group, alkyl group having 1 to 4 carbon atoms or alkenyl group having 2 to 4 carbon atoms, each $R^7$ is, independently from the others, a hydrogen atom, halogen atom or alkyl group having 1 to 4 carbon atoms, each $R^8$ is, independently from the others, a hydrogen atom or an alkyl group having 1 to 4 carbon atoms, the subscript a is 1 or 2, the subscript p is 0, 1, 2 or 3 and the subscript q is 1, 2 or 3 with the proviso that p+q does not exceed 4. Addition of these additional polyhydroxy aromatic compounds to the inventive positive-working photoresist composition has an effect to enhance the solubility of the resist layer in the exposed areas to an aqueous alkaline developer solution so that the effective photosensitivity of the composition can be improved.

When these additional polyhydroxy aromatic compounds are added to the composition, the amount thereof is in the range from 5 to 50% by weight or, preferably, from 10 to 35% by weight based on the amount of the component (a). Further, when the component (d) is used in the formulation of the inventive photoresist composition, the amount of the component (b) should be in the range from 5 to 100% by weight based on the total amount of the components (a) and (d) and the amount of the component (c) should be in the range from 0.1 to 0.5% by weight or, preferably, from 0.1 to 0.4% by weight based on the total amount of the components (a), (b) and (d).

It is of course further optional that the photoresist composition of the invention is admixed with various kinds of known additives conventionally used in photoresist compositions having miscibility with the above described essential components including auxiliary resins to improve the film-formability of the composition, plasticizers, stabilizers, coloring agents to improve the visibility of the patterned resist layer and so on each in a limited amount.

The positive-working photoresist composition of the present invention can be prepared by dissolving the above described essential and optional ingredients uniformly in a suitable organic solvent. Examples of suitable organic solvents include ketones such as acetone, methyl ethyl ketone, cyclohexanone and methyl isoamyl ketone, polyhydric alcohols and derivatives thereof such as ethyleneglycol, propyleneglycol, diethyleneglycol, ethyleneglycol monoacetate, propyleneglycol monoacetate and diethyleneglycol monoacetate as well as monomethyl, monoethyl, monopropyl, monobutyl and monophenyl ethers thereof, cyclic ethers such as dioxane, and esters such as ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

The procedure of the photolithographic patterning work using the inventive positive-working photoresist composition can be performed according to a conventional method. For example, a substrate such as a semiconductor silicon wafer is uniformly coated with the inventive photoresist composition in the form of a solution by using a suitable coating machine such as spinners followed by drying to form a photosensitive resinous layer which is then pattern-wise irradiated with actinic rays by the exposure to ultraviolet light emitted from low-, high- and ultrahigh-pressure mercury lamps, arc lamps and xenon lamps through a patterned photomask or with electron beams under pattern-wise scanning to form a latent image in the resinous layer. The thus formed latent image can be developed by dipping in a weakly alkaline aqueous solution such as a 1 to 10% by weight aqueous solution of tetramethyl ammonium hydroxide so as to dissolve away the resinous layer in the exposed areas leaving a patterned resist layer in the unexposed areas which is a reproduction of the photomask pattern with high fidelity.

In the following, the positive-working photoresist composition of the invention is illustrated in more detail by way of examples, which, however, never limit the scope of the invention in any way. In the following examples and comparative examples, in which the term of "parts" always refers to "parts by weight", the positive-working photoresist compositions prepared therein were evaluated for the following items by the testing procedures described there.

1. Photosensitivity:

A semiconductor silicon wafer was uniformly coated with the photoresist composition by using a spinner followed by drying on a hot plate at 110° C. for 90 seconds to form a resist layer having a thickness of 1.05 μm. The photoresist layer was pattern-wise exposed to ultraviolet light on a minifying projection-exposure machine (Model NSR-2005i9C, manufactured by Nikon Co., NA=0.57) for an exposure time of 0.1 second and stepwise increased exposure times each with a 0.01 second increment followed by a development treatment in a 2.38% by weight aqueous solution of tetramethyl ammonium hydroxide at 23° C. for 1 minute to dissolve away the resist layer in the exposed areas, rinse in a stream of running water for 30 seconds and drying to give a patterned resist layer on the substrate surface. The minimum exposure time, by which the resist layer in the exposed areas could be dissolved away completely, was recorded as a measure of the photosensitivity of the composition.

2. Resolution:

Recording was made of the critical resolution at an exposure dose by which a 0.30 μm width line-and-space pattern of the photomask could be reproduced.

3. Heat resistance:

A line-and-space patterned resist layer of 5 μm line width was formed on a silicon wafer and heated for 5 minutes on a hot plate at 125° C., 130° C., 135° C. or 140° C. to record the lowest temperature at which deformation was found in the patterned resist layer.

4. Cross sectional profile of line pattern:

A line-and-space patterned resist layer of 0.35 μm line width was formed on a silicon wafer and the cross sectional profile of the patterned line was examined on a scanning electron microscope to record the results in three ratings of: A for an orthogonal profile; B for a trapezoidal profile; and C for a trapezoidal profile with rounded shoulders.

5. Range of focusing depth:

Taking the exposure dose with which a resist layer of a line-and-space pattern of 0.30 μm line or space width, i.e. Eop, was formed on a silicon wafer in a 1:1 (line width):(space width) ratio by using a minifying projection exposure machine (Model NSR-2005i9C, manufactured by Nikon Co., NA=0.57) as the base exposure dose, exposure tests were undertaken at the Eop with a slight up or down shift of the focusing point followed by development. The cross sectional profile of the thus formed resist layer of the line-and-space pattern was examined on a scanning electron microscope and records were made of the largest range of the shift in the focusing point, by which an orthogonal cross sectional profile of 0.30 μm width could be obtained, as the range of focusing depth.

6. Exposure dose latitude:

The ratio of the Eop (see above) to the Eth, i.e. the exposure dose by which the resist layer on the exposed areas was completely dissolved away by the development treatment, was recorded as the exposure dose latitude. A larger Eop:Eth ratio means a larger latitude.

EXAMPLE 1

A cresol novolac resin was prepared from a mixture of m-cresol, p-cresol and 2,3,5-trimethyl phenol in a weight ratio of 40:44:16 and formalin in a conventional manner with oxalic acid as the catalyst. The thus prepared novolac resin was subjected to a fractionation treatment to remove the low molecular weight fractions so that the resin after fractionation had a weight-average molecular weight of 5000.

A photoresist composition was prepared by uniformly dissolving:

(i) 100 parts of the above prepared cresol novolac resin;

(ii) 4.75 parts of an esterification product from 1.0 mole of bis(5-cyclohexyl-4-hydroxy-2-methylphenyl)-2-hydroxyphenyl methane and 2.0 moles of naphthoquinone-1,2-diazide-5-sulfonyl chloride;

(iii) 23.75 parts of an esterification product from 1.0 mole of bis(5-cyclohexyl-4-hydroxy-2-methylphenyl)-3,4-dihydroxyphenyl methane and 2.0 moles of naphthoquinone-1,2-diazide-5sulfonyl chloride;

(iv) 9.50 parts of an esterification product from 1.0 mole of bis(4-hydroxyphenyl)-3-methoxy-4-hydroxyphenyl methane and 3.0 moles of naphthoquinone-1,2-diazide-5-sulfonyl chloride;

(v) 0.486 part of 4,4'-bis(diethylamino)benzophenone; and (vi) 24 parts of 4,6-bis[1-methyl-1-(4-hydroxyphenyl) ethyl]- 1,3-dihydroxy benzene, in 440 parts of a 9:1 by volume mixture of ethyl lactate and butyl acetate followed by filtration of the solution through a membrane filter of 0.2 μm pore diameter. The amount of the 4,4'-bis(diethylamino)benzophenone was 0.3% by weight based on the total amount of the other non-volatile ingredients (i) to (iv) and (vi).

This photoresist composition was subjected to the evaluation tests for the above described items to give the results shown in Table 1 below.

EXAMPLES 2 and 3

The experimental procedure was just the same as in Example 1 except that the compounding amount of the 4,4'-bis(diethylamino)benzophenone was decreased to 0.1% by weight or increased to 0.5% by weight, respectively, based on the total amount of the other non-volatile ingredients (i) to (iv) and (vi).

The results of the evaluation tests for the respective photoresist compositions are shown in Table 1.

COMPARATIVE EXAMPLE 1

The experimental procedure was just the same as in Example 1 except that the 4,4'-bis(diethylamino)benzophenone was omitted in the formulation of the photoresist composition.

The results of the evaluation tests for this photoresist composition are shown in Table 1.

COMPARATIVE EXAMPLES 2, 3 AND 4

The experimental procedure in each of Comparative Examples 2, 3 and 4 was just the same as in Example 1 except that the compounding amount of the 4,4'-bis(diethylamino) benzophenone was decreased to 0.01% by weight, increased to 1.0% by weight or increased to 2.0% by weight, respectively, based on the total amount of the other non-volatile ingredients (i) to (iv) and (vi).

The results of the evaluation tests for the respective photoresist compositions are shown in Table 1.

TABLE 1

| | | Photosensitivity, ms | Resolution, μm | Heat resistance, °C. | Cross sectional profile | Range of focusing depth μm | Exposure dose latitude Eop/Eth |
|---|---|---|---|---|---|---|---|
| Example | 1 | 215 | 0.26 | 135 | A | 1.0 | 2.52 |
| | 2 | 195 | 0.28 | 135 | A | 0.8 | 2.60 |
| | 3 | 250 | 0.26 | 135 | A | 0.8 | 2.60 |
| Comparative Example | 1 | 185 | 0.30 | 135 | B | 0.2 | 2.40 |
| | 2 | 185 | 0.30 | 135 | A | 0.4 | 2.40 |
| | 3 | 300 | 0.30 | 130 | C | 0.6 | 2.60 |
| | 4 | 385 | 0.32 | 130 | C | — | — |

What is claimed is:

1. A positive-working photoresist composition which comprises, as a uniform mixture:

(a) an alkali-soluble resin;

(b) an ester of naphthoquinone-1,2-diazide sulfonic acid and a polyhydroxy compound; and (c) a 4,4'-bis(dialkylamino) benzophenone in an amount in the range from 0.1% to 0.5% by weight based on the total amount of the components (a) and (b) in the composition; and wherein the amount of the component (b) is in the range from 5% to 100% by weight based on the amount of the component (a).

2. The positive-working photoresist composition as claimed in claim 1 in which the component (c) is 4,4'-bis(diethylamino) benzophenone.

3. The positive-working photoresist composition as claimed in claim 1 in which the amount of the component (c) is in the range from 0.1 to 0.4% by weight based on the total amount of the components (a) and (b).

4. The positive-working photoresist composition as claimed in claim 1 in which the component (a) is an alkali-soluble novolac resin.

5. A positive-working photoresist composition which comprises, as a uniform mixture:

(a) an alkali-soluble resin;

(b) an ester of naphthoquinone-1,2-diazide sulfonic acid and a polyhydroxy compound;

(c) a 4,4'-bis(dialkylamino) benzophenone; and (d) a polyhydroxy compound, the amount of the component (c) being in the range from 0.1% to 0.5% by weight based on the total amount of the components (a), (b) and (d) in the composition, and wherein the amount of the component (b) is in the range from 5% to 100% by weight based on the total amount of the components (a) and (d), and wherein the amount of the component (d) is in the range from 5% to 50% by weight based on the amount of the component (a).

6. The positive-working photoresist composition as claimed in claim 5 in which the component (c) is 4,4'-bis(diethylamino) benzophenone.

7. The positive-working photoresist composition as claimed in claim 5 in which the amount of the component (c) is in the range from 0.1 to 0.4% by weight based on the total amount of the components (a), (b) and (d).

8. The positive-working photoresist composition as claimed in claim 5 in which the component (a) is an alkali-soluble novolac resin.

9. The positive-working photoresist composition as claimed in claim 5 in which the component (d) is selected from the group consisting of the compounds represented by the general formula

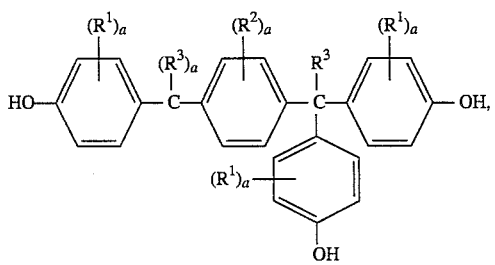

in which each $R^1$ is, independently from the others, a hydrogen atom, halogen atom, hydroxy group, alkyl group having 1 to 4 carbon atoms or alkenyl group having 2 to 4 carbon atoms, each $R^2$ is, independently from the others, a hydrogen atom, halogen atom or alkyl group having 1 to 4 carbon atoms, each $R^3$ is, independently from the others, a hydrogen atom or alkyl group having 1 to 4 carbon atoms and the subscript a is 1 or 2, the compounds represented by the general formula

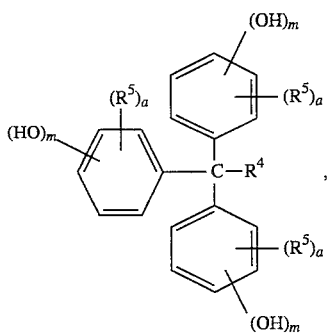

in which $R^4$ is a hydrogen atom or alkyl group having 1 to 4 carbon atoms, each $R^5$ is, independently from the others, a hydrogen atom, halogen atom, alkyl group having 1 to 4 carbon atoms or alkoxy group having 1 to 4 carbon atoms, the subscript a is 1 or 2 and the subscript m is 1, 2 or 3, and the compounds represented by the general formula

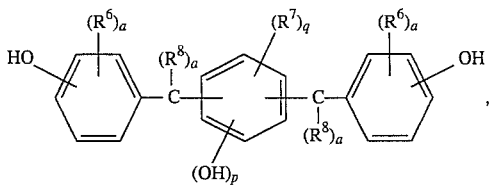

in which each $R^6$ is, independently from the others, a hydrogen atom, halogen atom, hydroxy group, alkyl group having 1 to 4 carbon atoms or alkenyl group having 2 to 4 carbon atoms, each $R^7$ is, independently from the others, a hydrogen atom, halogen atom or alkyl group having 1 to 4 carbon atoms, each $R^8$ is, independently from the others, a hydrogen atom or an alkyl group having 1 to 4 carbon atoms, the subscript a is 1 or 2, the subscript p is 0, 1, 2 or 3 and the subscript q is 1, 2 or 3 with the proviso that p+q does not exceed 4.

10. The positive-working photoresist composition as claimed in claim 9 in which the component (d) is 4,6-bis [1-methyl-1-(4-hydroxyphenyl)ethyl]-1,3-dihydroxy phenol.

* * * * *